US005784474A

United States Patent [19]

Kohut et al.

[11] Patent Number: 5,784,474

[45] Date of Patent: Jul. 21, 1998

[54] METHOD AND CIRCUIT FOR IMPROVING THE POLAR RESPONSE OF A TWO-WAY HORN-LOADED LOUDSPEAKER SYSTEM

[75] Inventors: Paul Kohut, Pacheco; Peter C. Soper, Albany; John D. Meyer, Berkeley, all of Calif.

[73] Assignee: Meyer Sound Laboratories Incorporated, Berkeley, Calif.

[21] Appl. No.: 337,637

[22] Filed: Nov. 10, 1994

[51] Int. Cl.$^6$ .......... H03G 5/00

[52] U.S. Cl. .......... 381/97; 381/156

[58] Field of Search .......... 381/59, 97, 98, 381/96, 99, 103, 156

[56] References Cited

U.S. PATENT DOCUMENTS

| | | | |
|---|---|---|---|
| 4,348,549 | 9/1982 | Berlant | 381/99 |
| 5,046,581 | 9/1991 | Mitchell | 381/156 |
| 5,185,801 | 2/1993 | Meyer | 381/59 |

FOREIGN PATENT DOCUMENTS

| | | | |
|---|---|---|---|
| 0007699 | 1/1982 | Japan | 381/98 |
| 0142900 | 6/1986 | Japan | 381/97 |

*Primary Examiner*—Curtis Kuntz
*Assistant Examiner*—Xu Mei
*Attorney, Agent, or Firm*—Donald L. Beeson

[57] ABSTRACT

A method and correction circuit for improving and controlling the listening window and response of a two-way loudspeaker system utilizing a horn-loaded high frequency driver. The correction circuit includes adjustable active all-pass and band-pass filters, in a specific arrangement, coupled with conventional cross-over filters to achieve a maximally flat amplitude and phase response acoustically throughout a preferred listening window. A spectrum analyzer measures the near-field responses of the individual and combined transducers while adjustments are made. A phase shifting circuit is included in the low frequency channel which results in improved near-field to far-field response consistency and significantly improves the subjective characteristics of the high frequency horn.

11 Claims, 6 Drawing Sheets

METHOD AND CIRCUIT FOR IMPROVING THE POLAR RESPONSE OF A TWO-WAY HORN-LOADED LOUDSPEAKER SYSTEM

BACKGROUND OF THE INVENTION

Field of the Invention

This invention relates to multi-way loudspeaker systems utilizing active or passive electronics for optimization, and more particularly to improving the polar response of a multi-way speaker system which uses a horn-loaded high frequency driver. The invention particularly addresses the difficulty of achieving acoustic coverage over a wide range of listening angles with horn-loaded speakers.

Heretofore, various passive and active correction circuits have been devised for achieving a linear phase and flat amplitude response, and hence better transient response, in a multi-way loudspeaker system. To varying degrees, these circuits take into account the phase response of individual transducers, the propagation delay from their acoustic positions, and adjust the electrical filters to flatten the overall response. One such method and circuit is disclosed in U.S. Pat. No. 5,185,801 to Meyer, et al. In Meyer, et al., a phase off-set is introduced into the high frequency channel of a non-horn-loaded two-way loudspeaker in order to off-set the phase of the high frequency transducer relative to the low frequency transducer within the cross-over frequency range. This phase off-set causes a forced deterioration of the on-axis response of the loudspeaker as compared to the off-axis response. The intended result in Meyer, et al. is to make the composite on-axis and off-axis amplitude and phase responses look substantially the same, and to also improve the transient response of the loudspeaker off-axis, as well as on-axis.

The circuit and method disclosed in Meyer et al., however, cannot effectively correct a speaker having a horn-loaded high frequency driver. In such a speaker, the method and circuit of Meyer et al., produces a large variation in near-field to far-field response. Also, Meyer, et al. does not contemplate the introduction of delay into the low frequency channel which could correct for the effective horn-loading on the acoustical center of the high frequency driver. Still further, use of the phase off-set technique disclosed in Meyer, et al., turns out to be ineffective when used with the greater directional characteristics of a horn and actually worsens the actual listening window of the speaker.

Other prior art correction circuits and methods generally correct (electrically and acoustically) responses for in-phase characteristics of the speaker's high and low-end frequency signal paths. None of the configurations and methods previously known lend themselves to applications where the high frequency transducer is horn-loaded. This can be understood partly by the fact that a horn-loaded high frequency driver will have a markedly different radiation pattern than a baffle-mounted low frequency driver. The result is that a listener can readily detect transitions from high to low frequencies, and vice versa, leading to a perceived unnatural colorization of the sound.

SUMMARY OF THE INVENTION

The present invention provides a method and circuit for achieving a flat amplitude and linear phase response, both in the near-field and far-field, of a two-way or multi-way horn-loaded loudspeaker system wherein a cross-over circuit divides the audio input signal between high and low frequency channels of the speaker. Briefly, the invention involves amplitude correction in series with the input to the cross-over circuit in conjunction with introducing phase shift in the low frequency channel within the cross-over frequency range. It is also contemplated that additional series phase correction will be provided before the cross-over. The method of the invention provides for optimizing the near and far-field phase and frequency responses of the system by iterative amplitude and phase correction at both a near and far-field position in front of the loudspeaker. It is further contemplated that the frequency and phase responses for the aforementioned iterative correction procedures will be performed by measuring the loudspeaker response by a microphone placed on-axis with the throat of the loudspeaker's horn-loaded high frequency driver.

It is therefore a primary object of the invention to provide a system and method for achieving a relatively flat acoustic amplitude and phase response in a two-way horn-loaded loudspeaker in the near-field and far-field throughout a large vertical listening window.

It is a further object of the invention to provide a circuit and method for eliminating the disturbing subjective characteristics of a horn-loaded speaker.

It is another object of present invention to provide a means for adjusting the acoustic amplitude and phase response of the individual transducers and their combined responses in a horn-loaded loudspeaker.

It is still another object of the present invention to provide a method for conveniently measuring and empirically adjusting the amplitude and phase response of a horn-loaded loudspeaker system.

It is yet another object of the invention to avoid unwanted off-axis amplitude peaks in a horn-loaded loudspeaker.

DESCRIPTION OF THE PREFERRED EMBODIMENT

Figure 1:
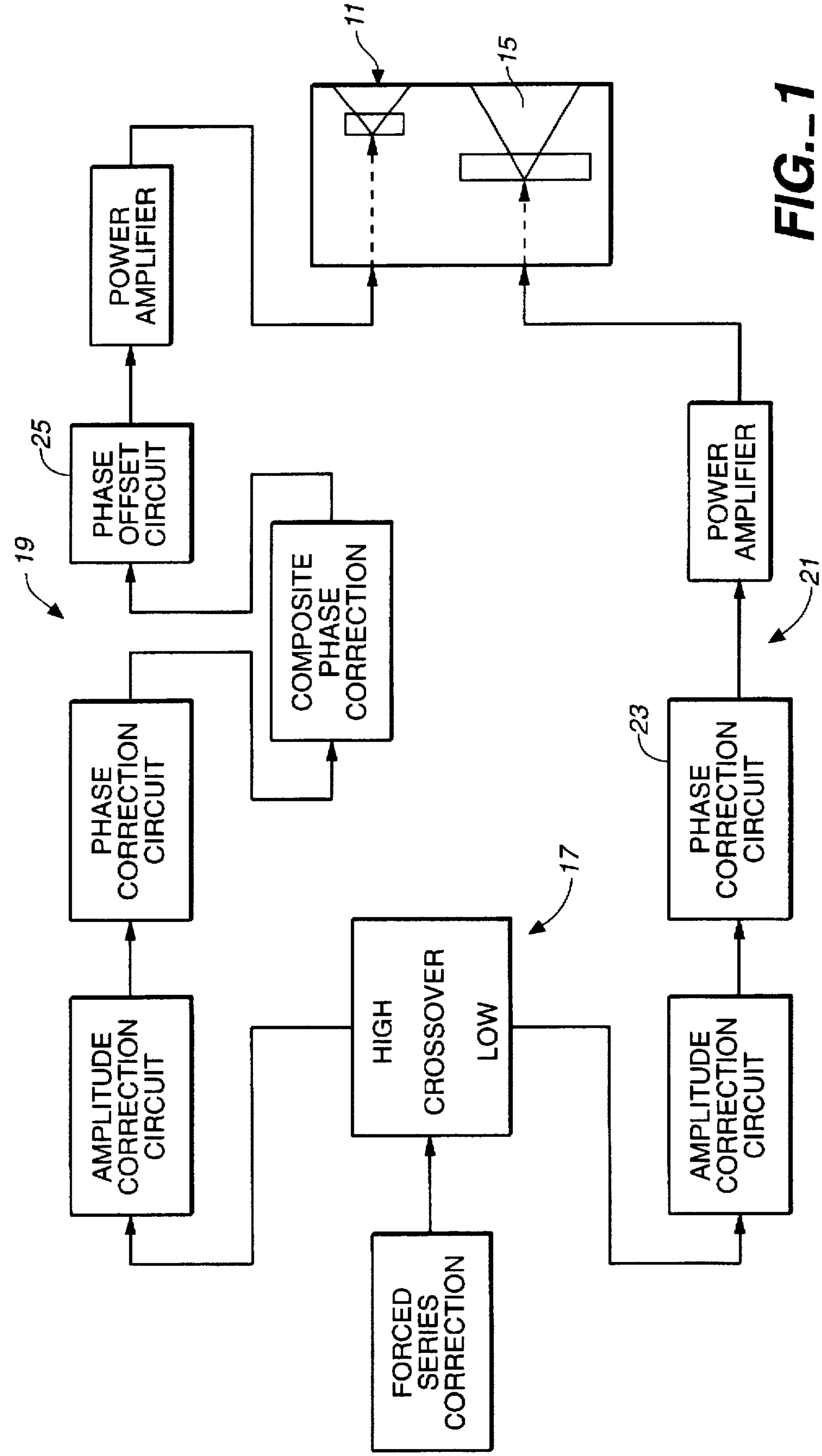
FIG. 1 is a block diagram of a prior art circuit used for correcting the transient response in a two-way loudspeaker system which is not horn-loaded.

Referring now to the drawings, FIG. 1 shows a prior art correction circuit for improving the transient behavior of a loudspeaker system as disclosed in the Meyer, et al., patent. In this figure, a speaker 11, has a high and low frequency driver 13, 15, neither of which is horn-loaded. The correction circuit, includes a cross-over circuit 17 for dividing the audio input signal between a high frequency channel 19 and a low frequency channel 21. Phase and amplitude correction is provided in both of the high and low frequency channels for separately correcting the phase and amplitude responses from each of the high and low frequency drivers 13, 15 over the drivers operating frequency range. As a consequence, the phase correction circuit 23 in the low frequency channel of the FIG. 1 circuit is not tuned to introduce phase correction within the cross-over frequency range. Rather, phase off-set within the cross-over frequency range is introduced by the phase off-set circuit 25 in the high frequency channel.

Figure 2:
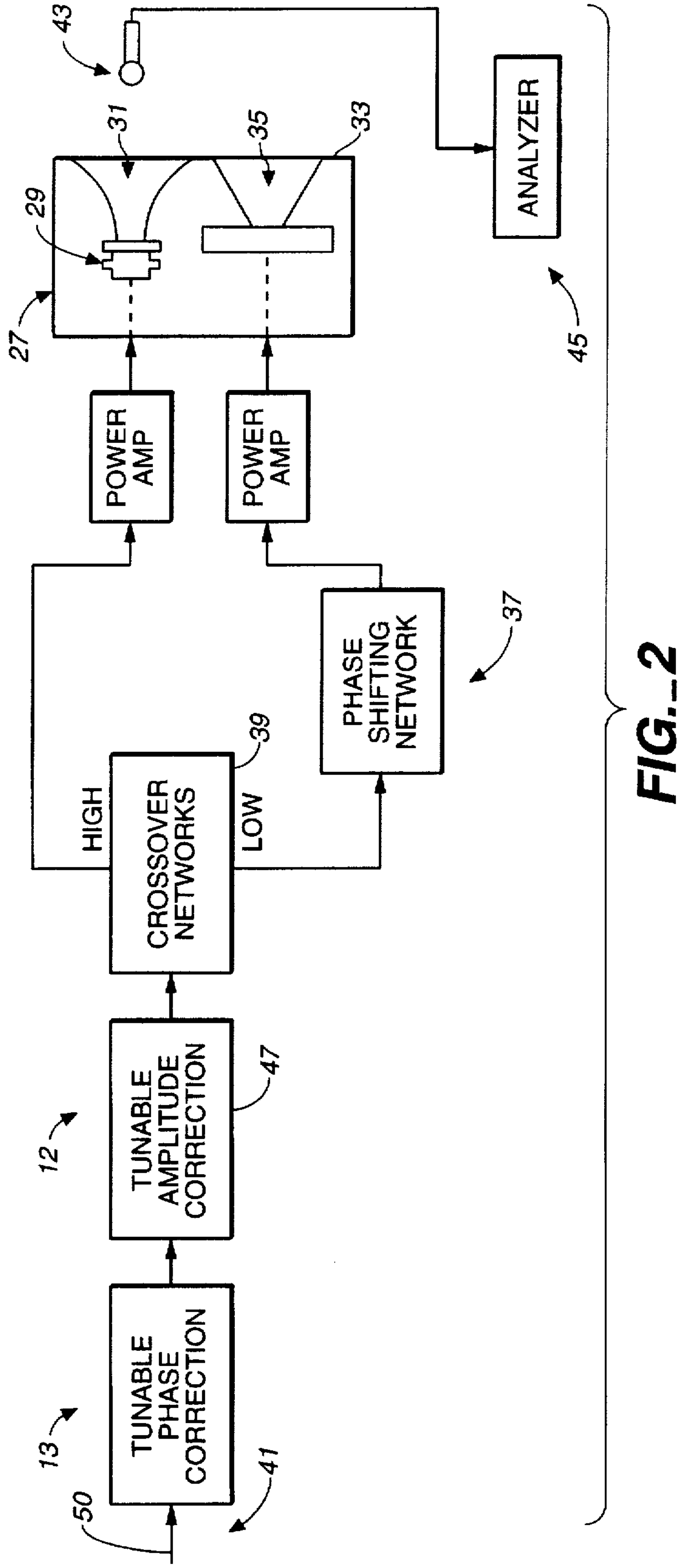
FIG. 2 is a block diagram of a correction circuit in accordance with the invention.

The correction circuit of FIG. 1 is to be compared with the correction circuit of FIG. 2 which shows the preferred embodiment of the present invention in a simplified block diagram form, wherein speaker enclosure 27 consists of a forward-facing low frequency driver 29, coupled to a horn 31, mounted to a front baffle 33 along with the forward-facing low frequency driver 35, which is not horn-loaded and both of which are forward-facing, i.e., they both face the same direction which is the direction of the listening area in front of the speaker. The specific contour of the horn 31 may be optimized for a variety of parameters including efficiency, beam-width, frequency response, distortion, etc. Most of these parameters will not affect the fundamental objectives of the patent, and in general are determined in part by the high frequency driver being used. Those skilled in the art will be familiar with the trade-offs for various horn designs. It is preferred, however, that the depth of the horn, in combination with the acoustic center of the high frequency driver, match the acoustic center of the low frequency driver when measured ½ meter away from the baffle surface 33 on-axis to the horn. This will determine the relative phase response of the two sources in the measurement space. If the acoustic center of the high frequency driver and horn is a shorter or longer distance to the measurement position, fixed delay circuitry may be added to the high or low frequency channels appropriately to compensate for this error. The circuitry, measurement, and alignment methods for this fixed delay are described in the Meyer, et al. patent.

The size and geometry of the enclosure 27, and low frequency driver (woofer) 35 can similarly take on variations to optimize other design goals, but the horn 31 and woofer should be placed as close together as possible. This is typical for many designs since it improves the polar pattern. Suitably, the woofer can be ten inches in diameter, and the horn approximately eight inches in diameter at the baffle opening, with the enclosure being approximately two cubic feet.

To achieve many of its features, the invention employs low order cross-over networks and transducers which extend in their frequency response beyond their cross-over cut-off. This arrangement effectively develops overlap in the acoustic responses of the high and low frequency channel. While this is often avoided in designs due to the larger interaction band, the present invention minimizes those adverse affects and makes this overlap an advantage. This overlap provides greater acoustic power and efficiency throughout the mid-band (cross-over) region due to the multiple sources, and more importantly creates a gradual transition from the horn response to the woofer response. The insertion and tuning of the phase shift network 37, mitigates many of the cancellation affects from near-field to far-field and off-axis. It is believed that this, in combination with the overlap, accounts for the subjective perceived quality of no horn in the system.

With the physical features of the enclosure described above, the approximate alignment parameters for cross-over circuit 39 are suitably as follows:

High-Pass: 2nd Order, $fc = 1.4\text{kHz}$ $Q = 0.64$

Low-Pass: 2nd Order, $fc = 1.4\text{kHz}$ $Q = 0.71$

Figure 3A:
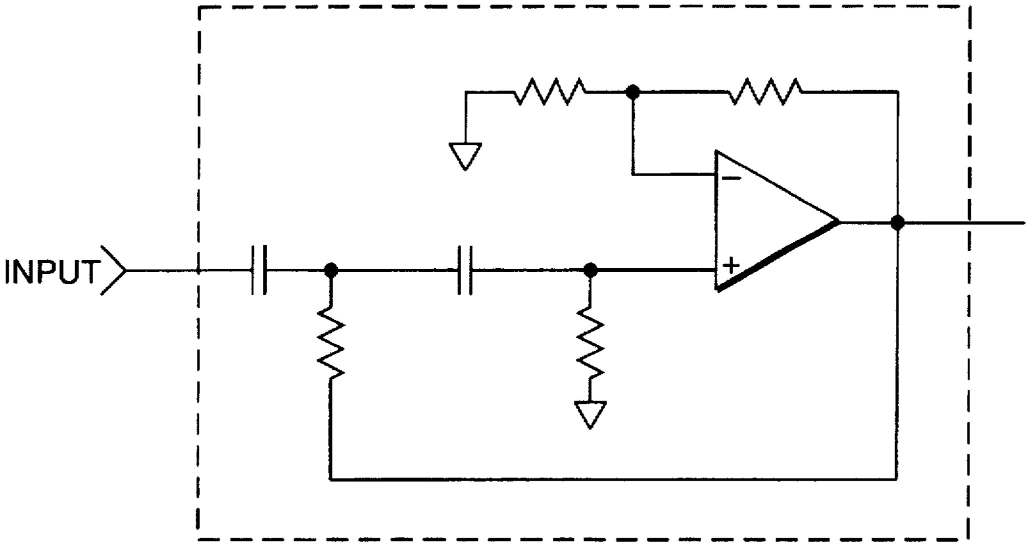
FIG. 3*a* is a circuit diagram of the high-pass filter of the cross-over circuit shown in FIG. 2.
Figure 3B:
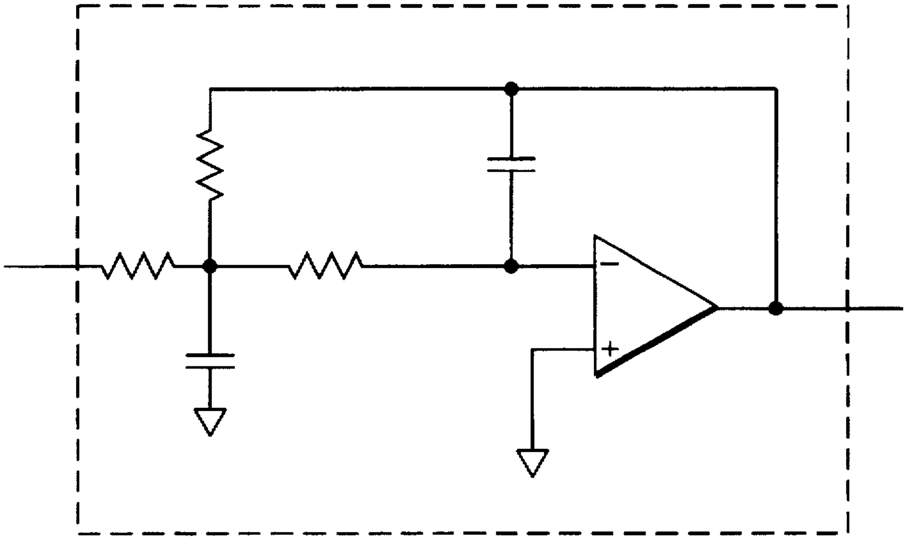
FIG. 3*b* is a circuit diagram of the low-pass filter of the cross-over circuit of FIG. 2.

FIG. 3*a* and 3*b* depicts two simple filter circuits which can be implemented to achieve the above parameters.

The use of tunable and fixed amplitude correction filters in the high and low paths is not required in the simplest form of the present invention. The present invention also does not preclude the use of those circuits and approach to accomplish correction, except for the phase offset circuit placed in the high path. That phase offset would directly interfere with circuits used presently. With the present invention's components and geometry, amplitude and phase correction can be accomplished prior to the cross-over network for both transducers.

Figure 4:
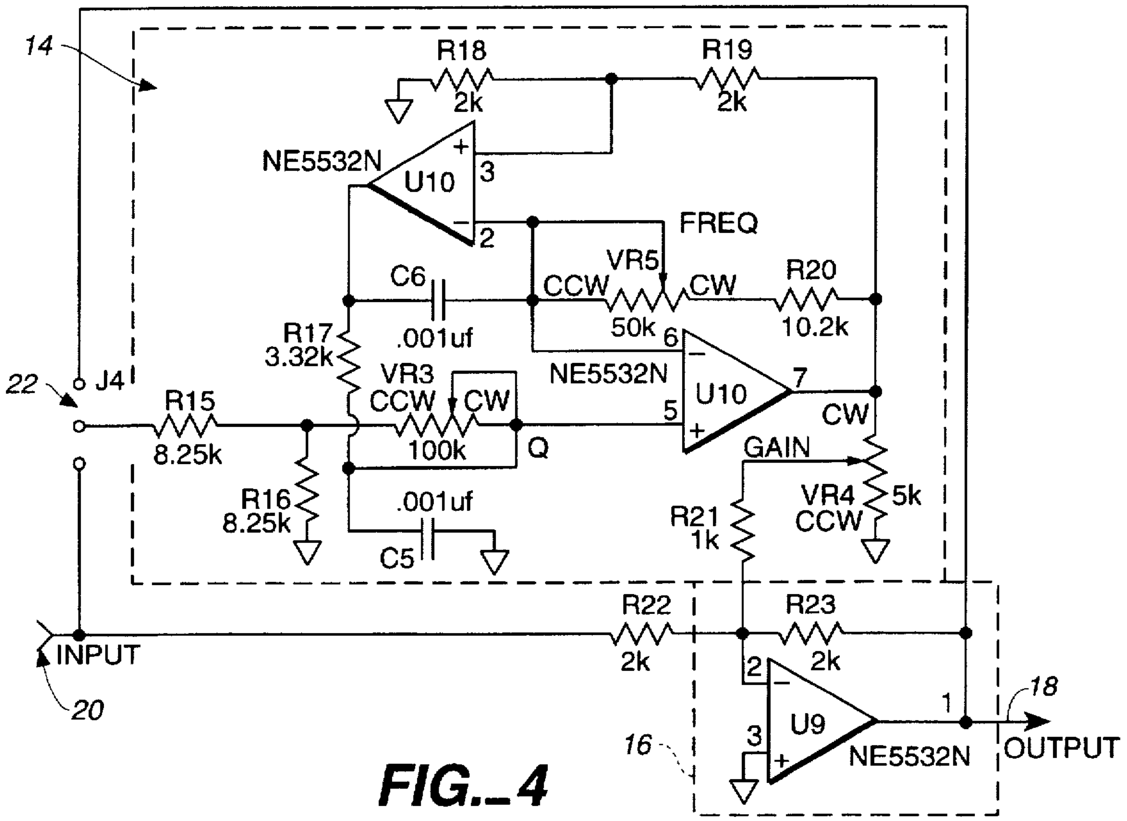
FIG. 4 is a circuit diagram of the tunable amplitude correction circuit shown in FIG. 2.

As a first test, the system is configured as shown in FIG. 4, except the phase shifting network 37 is bypassed and the tunable amplitude 12, and phase correction 13, circuits are set to zero, i.e. they will have flat amplitude and phase responses throughout the audio band. With this arrangement, a test signal is introduced to the input 41 of the system. A precision test microphone 43, is placed at ½ meter from the baffle surface on axis to the horn throat and its signal fed to a spectrum analyzer 45.

Those skilled in the field of electro-acoustic measurements will understand how to obtain accurate anechoic free-field measurements with appropriate equipment. Various instruments and test methods can be used for the measurements described herein. The requirements are that the measurements being taken are anechoic, i.e. unaffected by the environment. The analyzer must produce amplitude and phase data as a function of frequency and have means for removing the constant delay portion of the phase shift, later referred to as propagation delay compensation. The frequency resolution should be greater than 1/12 octave, amplitude resolution should be greater than 0.5 dB, and phase resolution greater than two degrees. Accuracy of the data should be as good as the resolution. An example of a suitable analyzer is the Meyer Sound Laboratories Incorporated, SIM System II.

With the test signal introduced to the input 41, and the phase and amplitude data being observed from the analyzer 45, the high and low channels are alternately switched on and off to verify they are in phase at the cross-over point (within ten degrees), and that they have the same average phase slope through the majority of their individual pass-band. When the appropriate amount of propagation delay compensation has been set by the analyzer, the phase will be flat as an average through the center of the low channel and high channel. If phase error exists, polarity change and/or appropriate phase delay needs to be added to the system as described in Meyer, et al.

Next, with both high and low frequency channels switched on, and the microphone still positioned at ½ meter, the tunable amplitude correction circuit 47 is engaged stage-by-stage and adjusted to correct each of the observed amplitude anomalies starting with the worst and stopping at a practical correction level. Typical five to ten stages may be needed to correct the composite amplitude to within 3 dB.

One stage of the tunable amplitude correction circuit is shown in FIG. 4. Here, an adjustable band-pass filter 14 is placed in either the feed-forward or feed-back path of summing op amp 16 by means of boost/cut jumper block 22.

This circuit allows for a boost or cut (i.e. attenuation) of the audio signal at the tuned center frequency of band-pass filter. The circuit also provides adjustment of center frequency, Q, and boost-out magnitude. N number of these stages can be cascaded in series from output 18 to input 20 to correct for the observed amplitude anomalies in the composite acoustic response. The implementation of the amplitude correction circuit of FIG. 6, including the mathematical modeling of this circuit, would be well understood to persons of ordinary skill in the art.

Once the amplitude correction is complete, the tunable phase correction circuit 49 is engaged stage-by-stage and empirically adjusted while observing the analyzer 45 to obtain maximally flat phase response throughout the audio band. Because each stage of the phase correction circuit produces a full 360° of phase shift, the analyzer propagation delay compensation will iteratively be increased as the stages are inserted. As a method, the analyzer propagation delay compensation may be initially incrementally set to flatten the greatest negative slope observed in the spectrum analyzer. This will result in a positive increasing phase with increasing frequency. The accumulated positive phase shift at the highest frequency will determine the number of stages required to fully flatten the phase by:

$$\#\text{ of Stages} = \frac{\text{Accumulated positive phase}}{360^\circ}$$

As a matter of practicality, the edges of the audio band may not be fully corrected.

Figure 5:
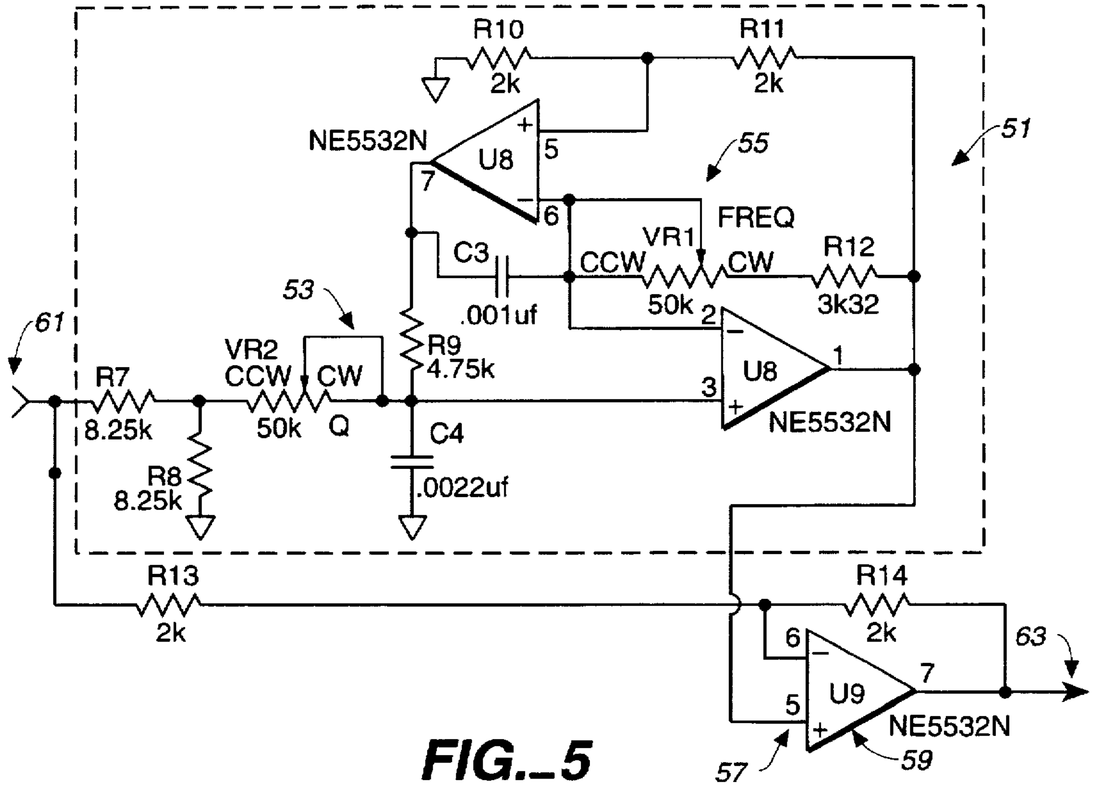
FIG. 5 is a circuit diagram of the tunable phase correction network shown in FIG. 2.

FIG. 5 shows one stage of the tunable phase correction circuit. This circuit can similarly be cascaded in series by connecting output to input to obtain the required total phase shift.

Figure 6:
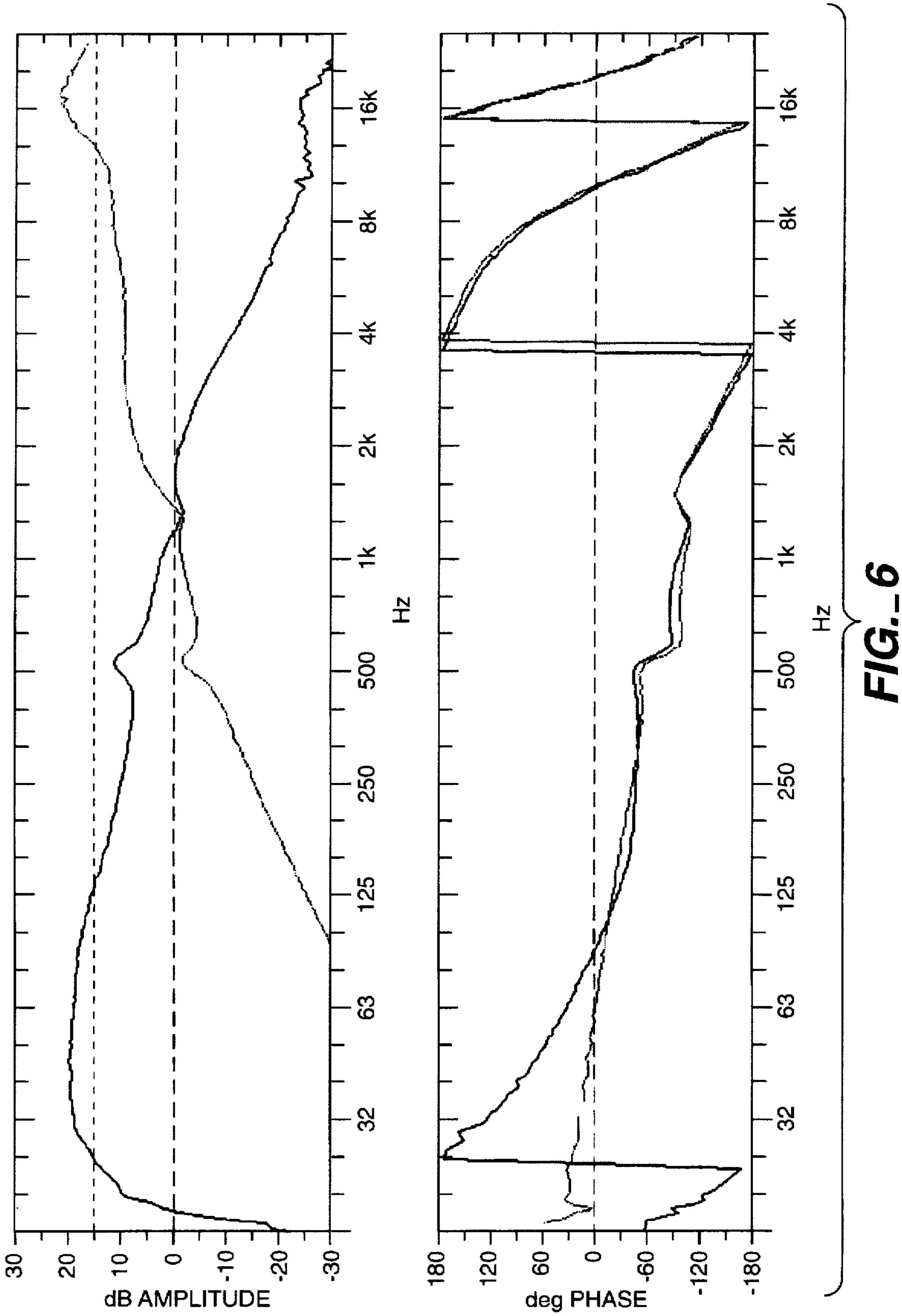
FIG. 6 is a plot of the electrical amplitude and phase of the low frequency channel and the high frequency channel response measured on an experimental system corrected without the phase shifting network in the low frequency channel.

The electrical response of the amplitude corrected system thus far is shown in FIG. 6 for the low channel and high channel, i.e. from the system input 50 to the speaker terminals. Note the phase response is everywhere in phase indicating no further improvement could be made.

As a next step, a tunable phase shifting network 37, is inserted in the low channel as depicted in FIG. 2. The network is a tunable second order all-pass filter identical to the ones used in the tunable phase correction circuit 49. Again, FIG. 5 shows a circuit diagram of this filter with appropriate tuning elements. The circuit of FIG. 5 includes band-pass filter 51 which is a dual amplifier band-pass, the center frequency and Q of which are tunable by means of trimpots 53, 55. The output of the band-pass filter 51 is connected to the reference (positive) terminal 57 of inverting op amp 59 which passes the audio signal inputted to input 61 to output 63. The filter 51 is initially set to a center frequency (where −180° phase shift occurs) slightly above the cross-over frequency, in the experimental case approximately 2 kHz. The filter is also initially set to low Q, approximately 0.5. It is noted that the all-pass filter of FIG. 5 could be implemented in a simpler form with less components by providing a fixed tune circuit instead of a tunable circuit. Such a fixed tune circuit would essentially be designed from the parameters of the illustrated variable all-pass circuit.

Now an iterative adjustment of the tunable amplitude correction circuit 47 and tunable phase shifting network 37 is performed while the microphone is moved between a ½ meter distance to the baffle 33 and a 2 meter distance, while keeping it on-axis to the horn throat. Appropriate propagation delay compensation also needs to be adjusted as described above during this process. Additional amplitude correction filters may need to be inserted to fully correct for new amplitude anomalies. The objective is to obtain a flat amplitude and phase response from the near-field to partially far-field position. Other points off-axis in the acoustic space can be observed for optimization as well.

Figure 7:
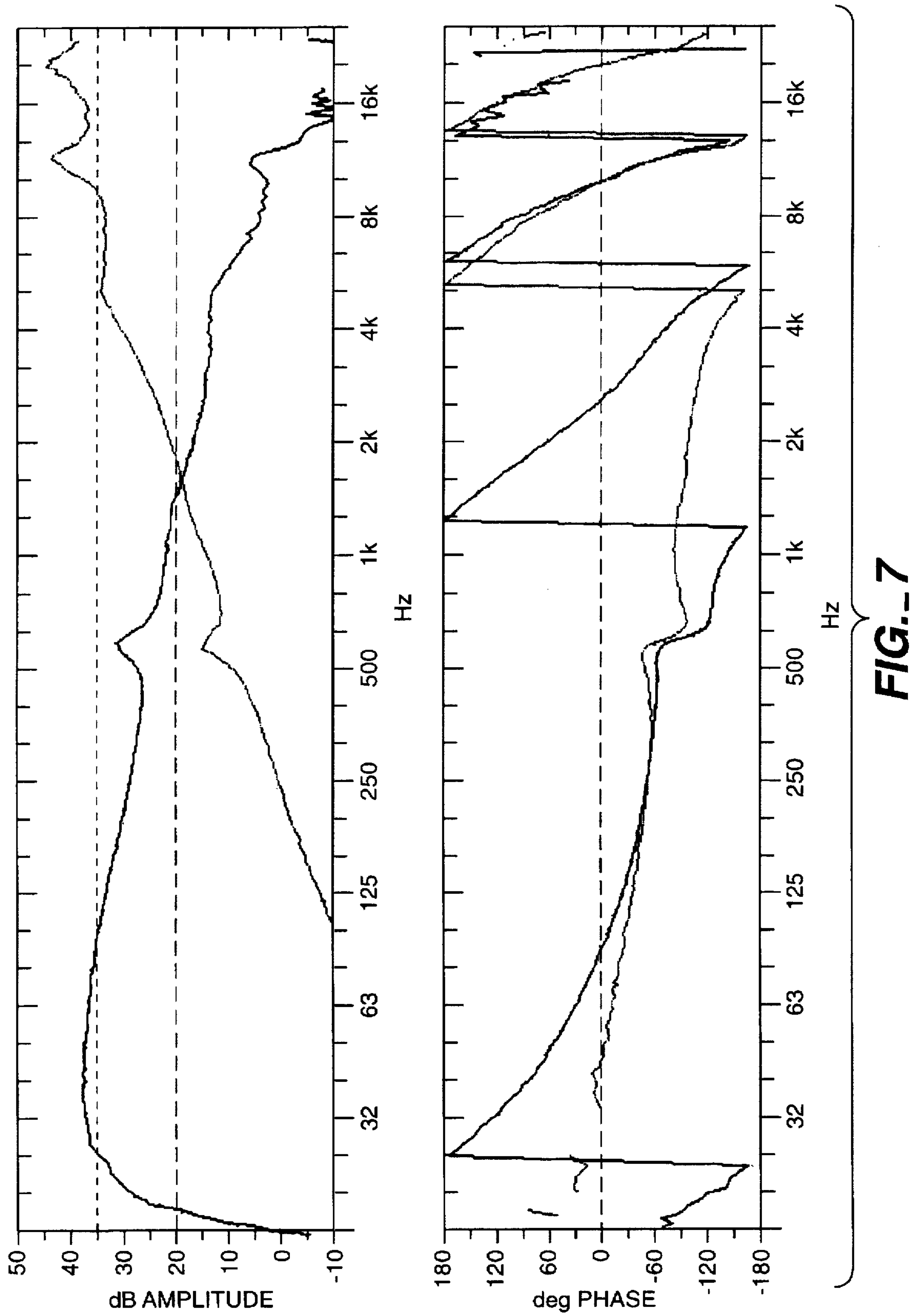
FIG. 7 is a plot of the electrical amplitude and phase of the low frequency channel and the high frequency channel response measured on an experimental system corrected with the phase shifting network inserted into the low frequency channel of the invention.

FIG. 7 shows the acoustic and electrical phase and amplitude response of the high and low frequency channel, and composite amplitude response of the fully-corrected experimental system taken at ½ meter distance to the baffle on-axis to the horn throat. In FIG. 7, it is seen that the amplitude response of the electrical signal to the high and low frequency drivers crosses over between 1 and 2 kHz. From the corresponding electrical phase response trace at the bottom of the figure, it can be seen that the phase response of the low frequency channel has greater negative slope throughout the cross-over region (generally from 500 Hz to 4 kHz) and has a greater negative slope than the phase response in this same region for the high frequency channel. This extra phase shift, that is, the more negative slope of the low frequency channel phase response, is introduced by the variable all-pass circuit illustrated in FIG. 5.

The circuits and methods described are not restricted to low voltage active analog filters. For example, the same results can be achieved using passive filters following the power amplifier or digital filters in the signal chain. Matching the complex response characteristics of the disclosed invention, without introducing new errors, is, of course, the objective in those cases. Appropriate tuning and DSP algorithms would need to be employed to carry out the described procedures.

Therefore, it can be seen that the present invention provides for a circuit and method for improving the polar response of a horn-loaded loudspeaker. While the invention has been described in considerable detail in the foregoing specification, it is understood that it is not intended that the invention be limited to such detail except as necessitated by the following claims.

What I claim is:

1. A correction circuit for improving the polar response of a loudspeaker system having at least two adjacent, forward-facing drivers designated a high frequency driver and a low frequency driver, and wherein said high frequency driver is horn-loaded, said correction circuit comprising

- a high frequency channel and a low frequency channel connectable, respectively, to the horn loaded high frequency driver and the low frequency driver of said loudspeaker system,
- a cross-over circuit operable over a cross-over frequency range and having an audio signal input, a high frequency channel output connected to said high frequency channel, and a low frequency channel output connected to said low frequency channel, said cross-over circuit acting to divide the frequency components of an audio input signal between said high frequency channel and low frequency channel for, respectively, driving said high frequency driver and low frequency driver,
- an amplitude correction circuit connected in series with the audio signal input of said cross-over circuit for correcting the measured amplitude characteristics of the composite acoustical output of the horn loaded high frequency driver and the low frequency driver, and
- a phase shifting network in said low frequency channel tuned to introduce phase shift in said low frequency channel in respect to said high frequency channel in the cross-over frequency range.

2. The correction circuit of claim 1 wherein said cross-over circuit includes a high pass and low pass filter and wherein said high and low pass filters are no greater than second order filters.

3. The correction circuit of claim 1 wherein said phase shifting network is tunable.

4. The correction circuit of claim 1 wherein said amplitude correction circuit is comprised of N number of cascaded stages of a band-pass filter wherein N is the number stages required to compensate for the number of amplitude anomalies in the composite acoustical output of the high and low frequency drivers.

5. The correction circuit of claim 1 wherein said tunable low frequency phase shifting network is comprised of a second-order all-pass filter.

6. A correction circuit for improving the polar response of a loudspeaker system having at least two adjacent, forward-facing drivers designated a high frequency driver and a low frequency driver, and wherein said high frequency driver is horn loaded, said correction circuit comprising a high frequency channel and a low frequency channel connectable, respectively, to the horn loaded high frequency driver and the low frequency driver of said loudspeaker system, a cross-over circuit having an audio signal input, a high frequency channel output connected to said high frequency channel, and a low frequency channel output connected to said low frequency channel, said cross-over circuit being comprised of second order high and low pass filters and acting to divide the frequency components of an audio input signal between said high frequency channel and low frequency channel for, respectively, driving said high frequency driver and low frequency driver, at least one tunable band-pass filter connected in series with the audio signal input of said cross-over circuit for correcting the measured amplitude characteristics the composite acoustical output of the horn loaded high frequency driver and the low frequency driver, at least one tunable substantially full band phase correction circuit connected in series with the audio signal input of said cross-over circuit for correcting the measured phase characteristics the composite acoustical output of the horn loaded high driver and the low frequency driver, and a tunable low frequency phase shifting network in said low frequency channel for introducing phase shift to the audio signal inputted to said low frequency driver after correcting the measured amplitude and phase characteristics of the composite acoustical output of the high and low frequency drivers.

7. A loudspeaker comprising a enclosure, a forward facing horn-loaded high frequency driver, a forward facing low frequency driver adjacent said high frequency driver, a cross-over circuit having an audio signal input, a high frequency channel output, and a low frequency channel output, said cross-over circuit acting to divide the frequency components of an audio input signal between said high frequency driver and low frequency driver, an amplitude correction circuit connected in series with the audio signal input of said cross-over circuit for correcting the measured amplitude characteristics of the composite acoustical output of the horn loaded high frequency driver and the low frequency driver, and a phase shifting network in said low frequency channel tuned to introduce phase shift in said low frequency channel in respect to said high frequency channel in the cross-over frequency range.

8. A method for improving the polar response of a loudspeaker system having at a forward facing horn loaded high frequency driver and an adjacent forward facing low frequency driver connected, respectively, to a high frequency channel and a low frequency channel, and further having a cross-over circuit including an audio signal input, a high frequency channel output and a low frequency output, an amplitude correction circuit connected in series with the audio signal input of the cross-over circuit, and a phase shifting network in the low frequency channel wherein the phase shifting network is tuned to introduce phase shift in the low frequency channel in respect to said high frequency channel in the cross-over frequency range established by said cross-over circuit, said method comprising the steps of (a) bypassing the phase shifting network in said low frequency channel, (b) placing a test microphone in front of the loudspeaker for measuring the composite amplitude versus frequency and phase versus frequency response of the loudspeaker, (c) measuring the composite amplitude versus frequency response of said high and low frequency drivers with the high and low frequency channels turned on, (d) correcting said composite amplitude versus frequency response by means of said amplitude correction circuit to achieve a substantially optimally flat measured amplitude versus frequency response substantially over the audio frequency range of the loudspeaker, (e) connecting the phase shifting network in said low frequency channel and measuring the composite phase verses frequency response of the loudspeaker substantially over its audio frequency range, (f) adjusting said phase shifting network to achieve a substantially optimally flat measured phase verses frequency response, and (g) repeating step (d) until a substantially optimally flat amplitude verses frequency and phase verses frequency response is achieved.

9. The method of claim 8 wherein step (d) is performed with the microphone at a first position designated a near field position in front of the loudspeaker, and at a second position designate a far field in front of the loudspeaker.

10. The method of claim 9 wherein the near-field position is approximately ½ meter from the loudspeaker and the far field position is approximately 2 meters from the loudspeaker.

11. The method of claim 8 wherein the microphone is position on axis with the horn loaded driver.

* * * * *